US006466087B2

(12) United States Patent
Ruha

(10) Patent No.: US 6,466,087 B2
(45) Date of Patent: Oct. 15, 2002

(54) METHOD AND APPARATUS PROVIDING DIGITAL ERROR CORRECTION FOR A CLASS D POWER STAGE

(75) Inventor: Antti Ruha, Oulu (FI)

(73) Assignee: Nokia Mobile Phones, Ltd., Espoo (FI)

( * ) Notice: Subject to any disclaimer, the term of this patent is extended or adjusted under 35 U.S.C. 154(b) by 33 days.

(21) Appl. No.: 09/752,710

(22) Filed: Dec. 28, 2000

(65) Prior Publication Data

US 2002/0084843 A1 Jul. 4, 2002

(51) Int. Cl.[7] ............................ H03F 3/38; H03F 21/00; H03F 3/217
(52) U.S. Cl. ....................... 330/10; 330/207 A; 330/251
(58) Field of Search ............................. 330/207 A, 10, 330/251, 9, 293

(56) References Cited

U.S. PATENT DOCUMENTS

| | | | |
|---|---|---|---|
| 5,144,308 A | | 9/1992 | Norsworthy |
| 5,745,061 A | | 4/1998 | Norsworthy et al. |
| 5,777,512 A | * | 7/1998 | Tripathi et al. .......... 330/207 A |
| 5,889,482 A | | 3/1999 | Zarubinsky et al. |
| 5,901,176 A | * | 5/1999 | Lewison ................. 332/109 |
| 5,990,815 A | | 11/1999 | Linder et al. |
| 5,990,819 A | | 11/1999 | Fujimori |
| 6,011,501 A | | 1/2000 | Gong et al. |
| 6,087,969 A | | 7/2000 | Stockstad et al. |
| 6,140,952 A | * | 10/2000 | Gaboury ................. 341/143 |
| 6,150,969 A | * | 11/2000 | Melanson ................ 341/143 |
| 6,344,811 B1 | * | 2/2002 | Melanson ................ 341/143 |

FOREIGN PATENT DOCUMENTS

| | | | |
|---|---|---|---|
| WO | WO 98/44626 | 10/1998 | ........... H03F/3/217 |

OTHER PUBLICATIONS

Multibit Σ–Δ A/D Converter Incorporating A Novel Class of Dynamic Element Matching Techniques; Leung, Bosco H et al; IEEE Transactions on Circuits and Systems II Analog and Digital Signal Processing, vol. 39 No. 1; Jan. 1992.

Linearity Enhancement of Multibit ΔΣ A/D and D/A Converters Using Data Weighted Averaging; Baird, Rex T. et al; IEEE Transactions on Circuits and Systems II Analog and Digital Signal Processing, vol. 42 No. 12; Dec. 1995.

A Noise–Shaping Coder Topology for 15+ Bit Converters; Carley, L. Richard; IEEE Journal of Solid–State Circuits, vol. 24, No. 2; Apr. 1989.

* cited by examiner

*Primary Examiner*—Patricia T. Nguyen
(74) *Attorney, Agent, or Firm*—Harrington & Smith, LLP

(57) ABSTRACT

Disclosed is a method and class D amplifier circuitry for compensating a pulse width modulated (PWM) signal. The method includes steps of generating a PWM signal for application to a driver stage; obtaining a filtered difference between the PWM signal and a version of the same PWM signal after the driver stage; generating a correction signal that is indicative of a sign of the filtered difference; and using the correction signal for adjusting at least one of the leading edge or the trailing edge of the PWM signal so as to compensate the version of the same PWM signal after the driver stage. The steps of obtaining and generating include steps of RC filtering, digital comparison and digital filtering. In the preferred embodiment the step of generating generates a one-bit correction signal. The correction signal is used to compensate the version of the same PWM signal after the driver stage for driver stage non-linearities and for power supply noise and variations. The PWM signal is preferably in a thermometer format, although other formats can be used, and the step of adjusting includes initial steps of combining two successive samples into one longer sample, and interpolating the longer sample by a factor in a range of about two to eight. In the presently preferred embodiment the step of generating generates the PWM signal from a multi-bit signal output from a sigma-delta modulator, where the multi-bit signal has $2^n$ quantization levels, where n is in a range of about two to about eight.

28 Claims, 12 Drawing Sheets

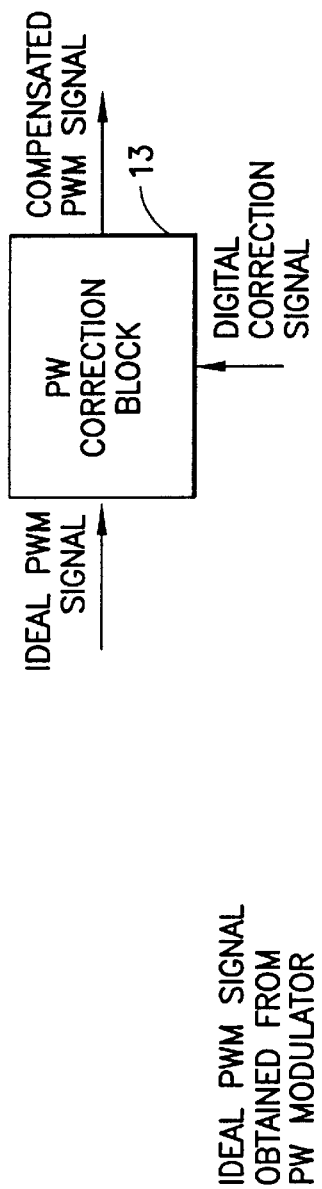
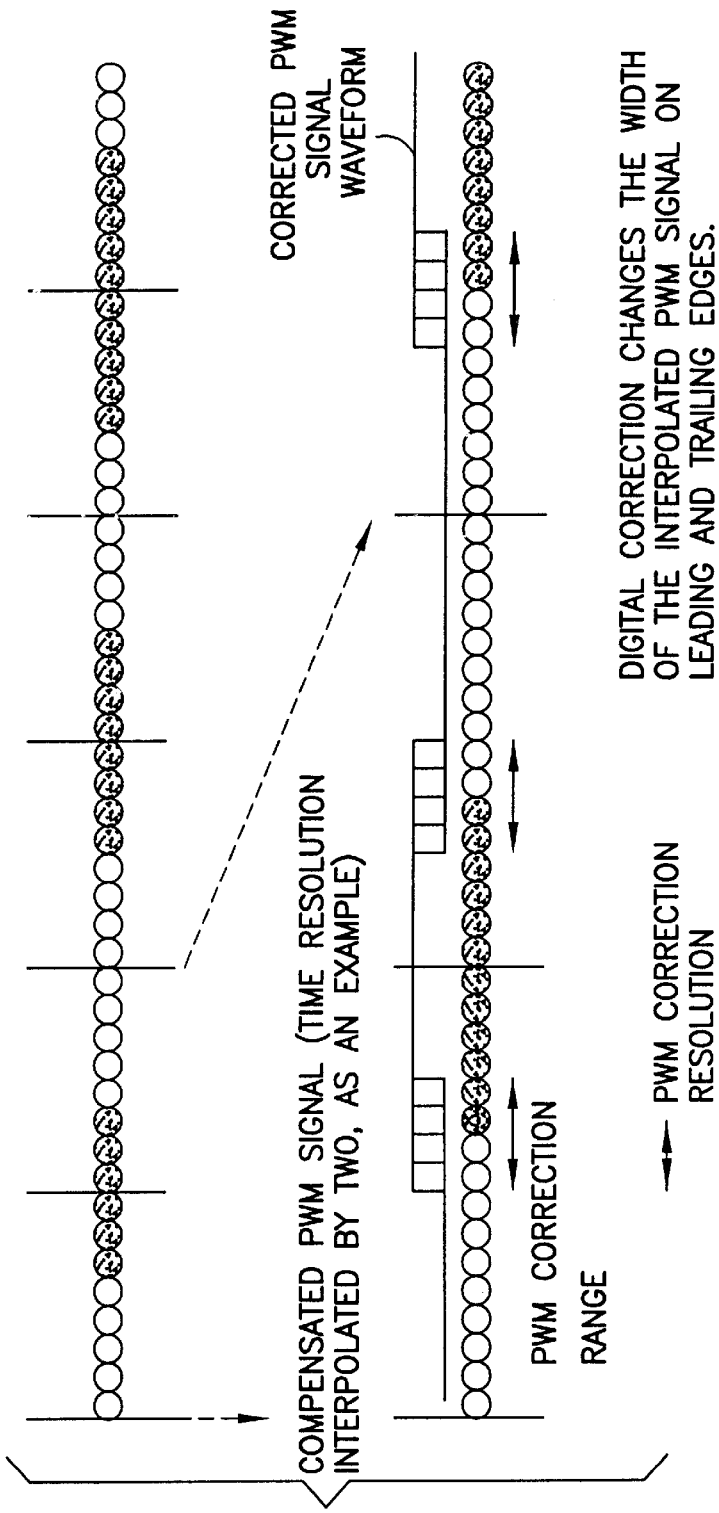
FIG.7A
FIG.7B

METHOD AND APPARATUS PROVIDING DIGITAL ERROR CORRECTION FOR A CLASS D POWER STAGE

FIELD OF THE INVENTION

This invention relates generally to amplifier circuitry and, more specifically, to class D amplifier circuitry having a modulator and a switching power stage.

BACKGROUND OF THE INVENTION

Class D amplifiers are well known and widely used. Class D amplifiers are particularly useful in applications where high efficiency is required, such as in power amplifiers, regulators and similar types of circuitry. The high efficiency of the class D amplifier (e.g., about 90%) makes it particularly attractive for use in battery-powered applications, such as portable radios, tape and CD players, and personal communicators, including wireless devices such as cellular telephones and mobile terminals.

A disadvantage of the class D amplifier is that it generates noise due to the on-off switching of the active element(s) in the switching stage.

Reference is made to FIG. 1 for showing a conventional audio reproduction path (ARP) 1. The ARP 1 includes a digital-to-analog converter (DAC) 2 that receives an N-bit digital code representing the digitized audio signal to be reproduced. The analog output signal of the DAC 2 is fed to a lowpass smoothing filter 3, and the smoothed analog signal is then input to a linear audio power amplifier 4 (e.g., class A, B, AB). The output of the linear power amplifier 4 drives an external speaker 5. Single bit sigma-delta techniques ( a digital modulator and single bit DAC) to achieve the desired conversion accuracy are typically employed by the DAC 2.

While the digital modulator can be implemented with state-of-the-art integrated circuit fabrication techniques, such as digital CMOS techniques using narrow linewidths and low supply voltages, implementing the DAC stage and linear power amplifier 4 have become increasingly difficult to implement using these processes, while achieving a desired performance level. As such, a mixed-signal process can be used.

While high performance can be achieved with the linear amplifier 4, such as a class A, B or AB amplifier, the power efficiency is below 50% at best, resulting in the generation of excess heat as well as increased battery power consumption.

FIG. 2 shows a conventional class D ARP 6. An input N-bit digital signal (e.g., 13 to 16 bits) is a applied to a digital modulator 7 where it is modulated to a one bit pulse width modulated (PWM) or a pulse density modulated (PDM) format. The PWM or PDM signal drives a switching driver 8, such as a conventional H-bridge driver configuration or an inverter, that provides a buffered modulated digital signal to a low pass filter 9. The resulting filtered analog signal is used to drive the external speaker 5.

A significant advantage of the class-D amplifier chain depicted in FIG. 2 is the high efficiency that can be achieved, typically as much as 90%. However, the linearity is degraded by the presence of second order effects, such as noise coupling from the power supply lines and non-ideal H-bridge switching characteristics. This is shown in FIGS. 3A and 3B, where the difference between the ideal and the actual PWM signal corresponds to driver errors, power supply noise and power supply variations. The switching and quantization noise spectrum also contains high noise levels at high frequencies, resulting in the need for the external lowpass (LC) filter 9 to avoid unnecessary power transmission and consumption, as well as to reduce undesirable noise radiation (EMC).

An analog implementation of the modulator 7 for class D operation is possible to achieve. This approach avoids many of the non-ideal characteristics introduced by the use of the digital modulator. However, a DAC is required to interface between the analog and the digital domains, reducing the overall compactness and increasing the cost and power consumption.

It should be noted that the use of the digital modulator 7 actually provides a number of advantages for mobile wireless terminals. These advantages include an increased integration level (for achieving a so-called "single-chip" baseband subsystem), ease of design and testing, and compactness due to the inherent digital to analog conversion. However, a direct class D implementation (no feedback) can only achieve about 50–60 dB SNDR, as it is limited by the non-ideal switching characteristics. Also, the tolerance for power supply noise (power supply rejection ratio PSRR) is also low, typically about 0–6 dB.

One known approach to solving these problems is to employ the use of feedback based on a high resolution analog-to-digital converter (ADC) to measure the output signal waveform for deriving a correction signal. However, the required resolution and speed of the ADC makes this approach unattractive for applications where cost is an important consideration.

Another feedback technique can be found in WO98/44626, where digital modulation is used with analog pulse width correction. The pulse width correction is based on a reference PWM waveform and analog pulse width adjustment. However, the use of analog components and circuits is generally a disadvantage when it is desired to implement the circuitry in a low power consumption digital integrated circuit (e.g., in a digital CMOS IC).

OBJECTS AND ADVANTAGES OF THE INVENTION

It is a first object and advantage of this invention to provide a class D amplifier circuit arrangement that employs feedback from the output to the digital input of the power stage, using a minimum of passive or active analog components.

It is a further object and advantage of this invention to provide a class D amplifier circuit arrangement that employs a feedback loop implemented with a comparator, providing a one bit converter function indicating a sign of a loop error signal, that has an output that may be digitally filtered and employed to digitally adjust a power stage input signal to attenuate noise resulting from power supply noise and variations and power stage non-linearities.

SUMMARY OF THE INVENTION

The foregoing and other problems are overcome and the foregoing objects and advantages are realized by methods and apparatus in accordance with embodiments of this invention.

Disclosed is a method and circuitry for compensating a pulse width modulated (PWM) signal. The method includes steps of generating a PWM signal for application to a driver stage; obtaining a filtered difference between the PWM signal and a version of the same PWM signal after the driver stage; generating a correction signal that is indicative of a sign of the filtered difference; and using the correction signal for adjusting at least one of the leading edge or the trailing edge of the PWM signal so as to compensate the version of the same PWM signal after the driver stage. The steps of obtaining and generating include steps of RC filtering, digital comparison and digital filtering. In the preferred embodiment the step of generating generates a one-bit correction signal. The correction signal is used to compensate the version of the same PWM signal after the driver stage for driver stage non-linearities and for power supply noise and variations.

The step of adjusting includes initial steps of combining two successive digital samples into one longer PWM sample, and interpolating the longer PWM sample by a factor in a range of about two to eight. The step of adjusting can also operate on one digital sample, where the one sample is simply doubled before interpolation. The PWM sample is preferably in a thermometer format, although other formats can be employed.

In the presently preferred embodiment the step of generating generates the PWM signal from a multi-bit signal output from a sigma-delta modulator, where the multi-bit signal has $2^n$ quantization levels, where n is in a range of about two to about eight.

BRIEF DESCRIPTION OF THE DRAWINGS

The above set forth and other features of the invention are made more apparent in the ensuing Detailed Description of the Invention when read in conjunction with the attached Drawings, wherein:

FIG. 5A shows the pulse width modulator (PWM) of FIG. 4, while

FIG. 6A shows the error measurement block of FIG. 4, while

FIG. 7A shows the pulse width correction (PWC) block of FIG. 4, while FIG. 7B is a diagram that is useful in explaining the operation of the PWC block;

DETAILED DESCRIPTION OF THE INVENTION

Figure 4:
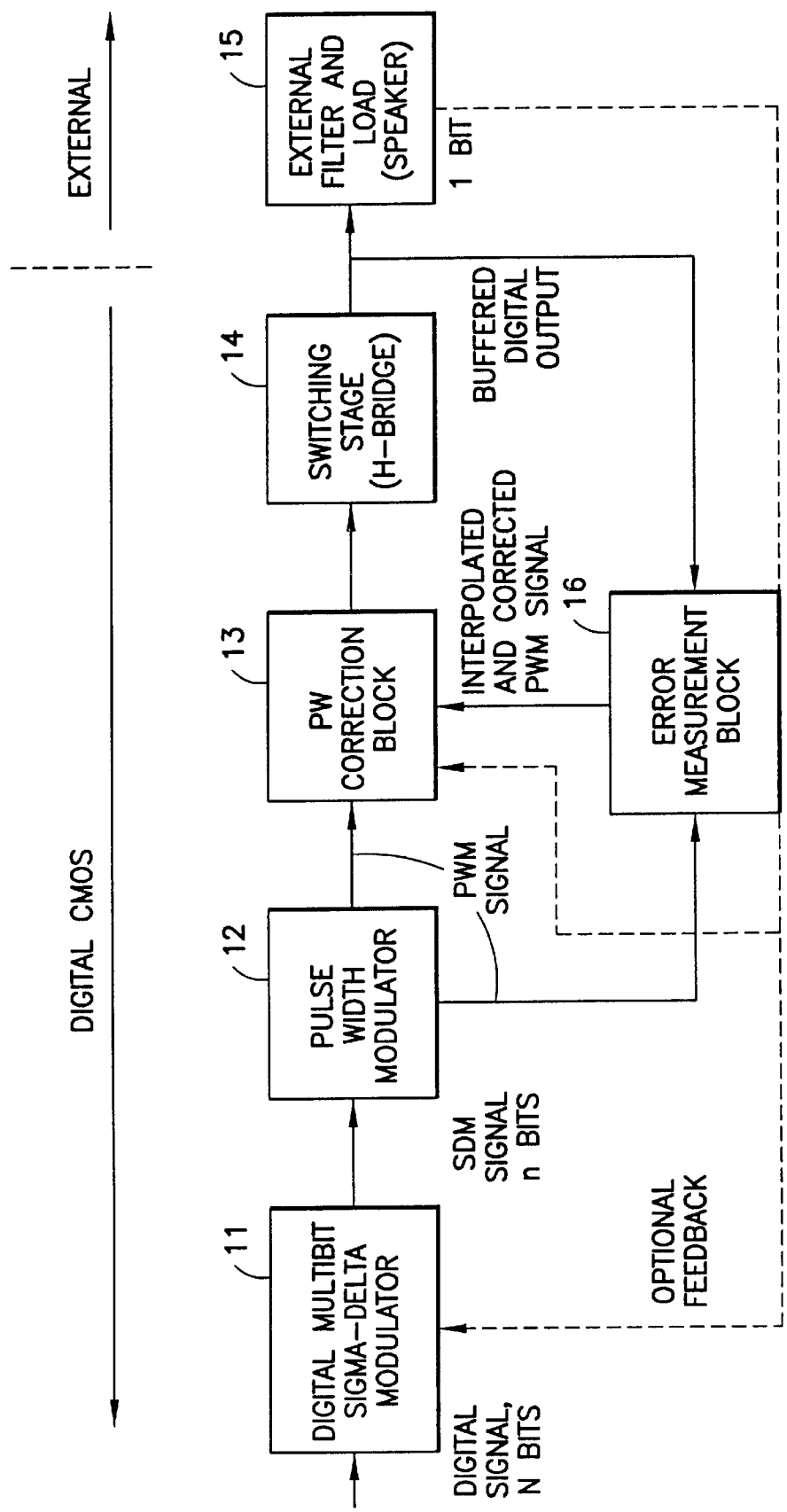
FIG. 4 is a block diagram of a class D modulator and power stage in accordance with the teachings of this invention.

FIG. 4 is a block diagram of a class D modulator and power stage 10 in accordance with the teachings of this invention. The input signal is an N-bit digital signal (e.g., 13–16 bits in binary or two's complement or some other suitable format) that is applied to a digital multi-bit sigma-delta modulator (SDM) 11. The output of the SDM 11 is an n-bit signal that is applied to a pulse width modulator (PWM) 12 that outputs a PWM output signal to a PW correction block 13, where the pulse width is varied to correct for non-linearities and power supply noise. The PWM signal is also applied as a reference signal to an error measurement block 16, that generates a correction signal that is input to the PW correction block. The error measurement block 16 generates the correction signal by comparing the PWM reference signal input to a buffered output signal taken from a switching stage 14 (e.g., implemented as an H-bridge) that is driven by an interpolated and corrected PWM signal output from the PW correction block 13. All of these components are suitable for fabrication as a digital circuit, thereby overcoming certain of the problems referred to above. The output of the switching stage 14 is used to drive an external filter and load, such as a speaker 15. Typically the block 15 will contain an LC filter in series with the speaker 15.

The sigma-delta modulator 11 interpolates the high accuracy input signal (e.g., 13–16 bits) to an oversampled lower resolution, but multi-bit (e.g., 2 bit to 8 bit), digital signal format. The known advantages of the multi-bit sigma-delta convertor are employed to advantage in the input stage, in particular the inherent low quantization noise (e.g., 6 dB/additional bit) and more predictable noise spectra at high frequencies (at least 10 dB to 20 dB lower than that obtained with conventional 1-bit modulators).

The operation of the circuitry can be explained in accordance with the following example. The output of the sigma-delta modulator 11 is converted to, for example, a temperature code format (see FIGS. 5A and 5B), and the corresponding $2^n$ bits are applied in parallel to an output register and read out serially at $2^n$ times the clock rate of the sigma-delta modulator 11 to control the class D output stage (or DAC). The PWM 12 may be implemented by reversing the read-out order of the bits of every other sample and, at the same time, the effective switching rate is halved. In a further embodiment the output bits are outputted serially, in temperature code format, and then in reverse order. In this case the effective sample rate is the same as the sigma-delta modulator 11.

Those skilled in the art will recognize that the PWM 12 can be implemented using other techniques, such as by using a triangular reference signal and digital counters.

The mode of operation described above is shown in FIG. 5B, which serves to improve the performance, especially when using highly optimized sigma-delta modulators where successive output words are non-correlated to some extent due to high frequency quantization noise. In this way the performance of the PWM technique is maintained even when using optimized sigma-delta modulators.

Figure 5C:
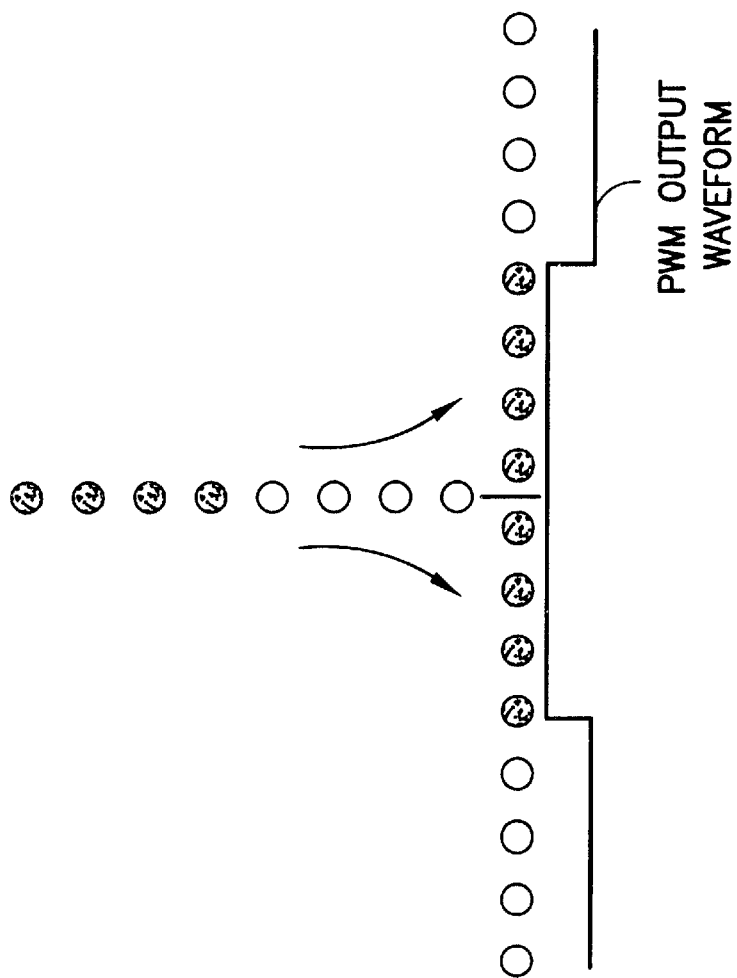
FIG. 5B is a diagram that is useful in explaining the operation of the PWM and FIG. 5C illustrates the doubling of one sample to form a PWM waveform.
Figure 5A:
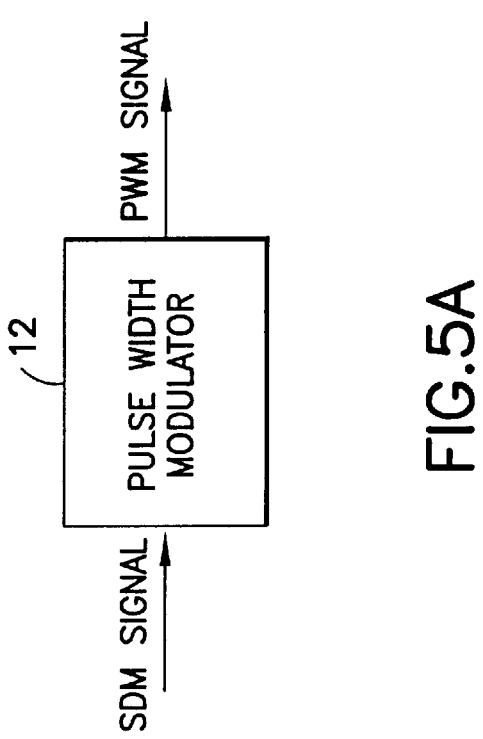
Figure 5B:
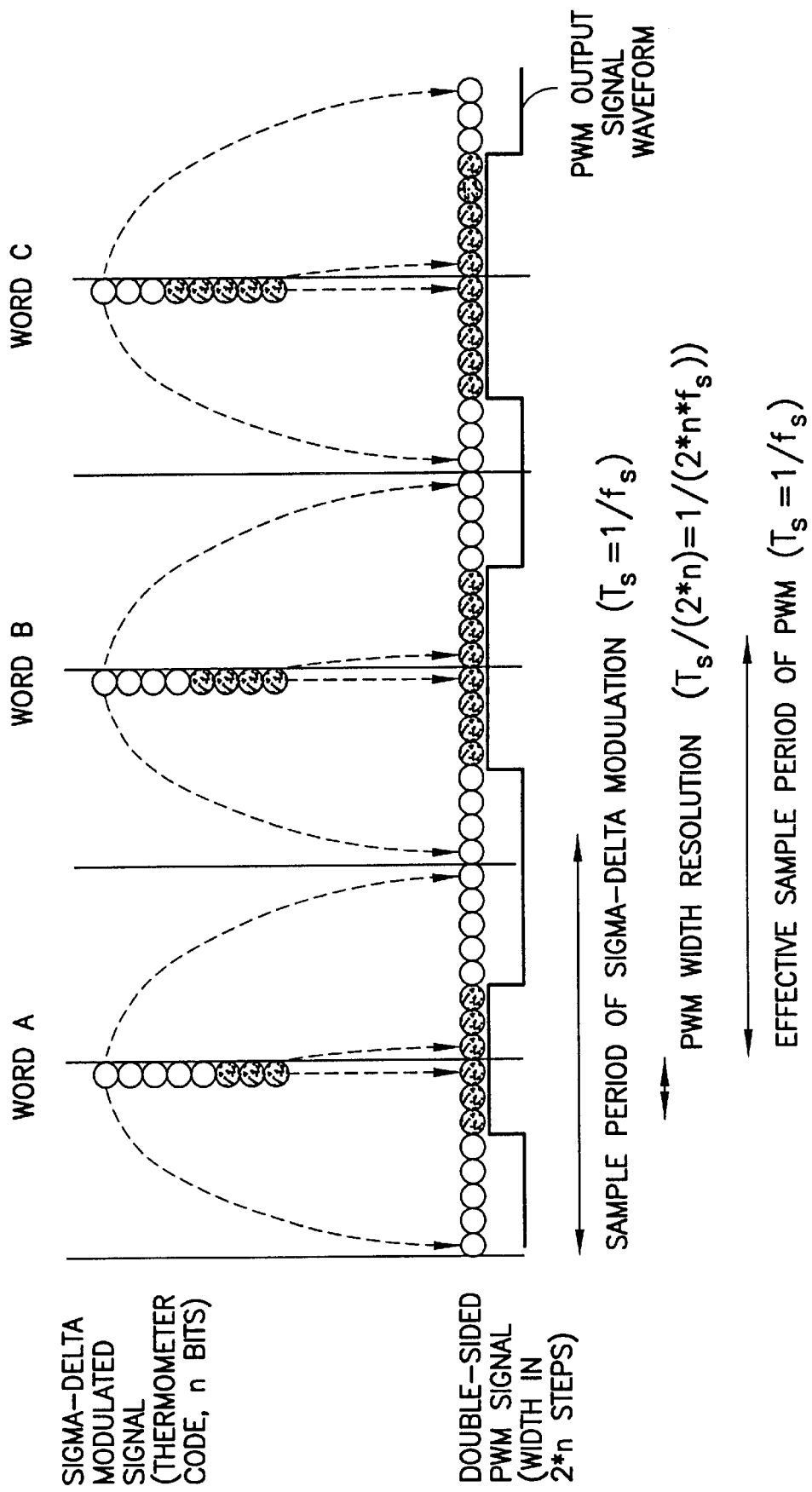

FIG. 5B shows the use of the thermometer code, wherein increasing values are indicated by setting additional bits in the output word (shown by example as an 8-bit output thermometer word, n=3) of the sigma-delta modulator 11. In the Figure Word B is larger in magnitude than Word A (by one bit), and Word C is larger in magnitude than Word B (also by one bit). The PWM 12 operates to set its pulse width accordingly, by effectively arraying the output words in normal and reversed form, thereby forming a larger word of (in this example) 16-bits ($2*2^n$). As is shown, the pulse width of the resulting output waveform of the PWM modulator 12 corresponds to the number of bits that are set in the larger word formed by the PWM 12.

The teachings of this invention are not limited for use with the thermometer code as, for example, binary and two's complement formats could be used as well.

It is also within the scope of these teachings to simply double one sample, as is conceptually illustrated in FIG. 5C.

Figure 1:
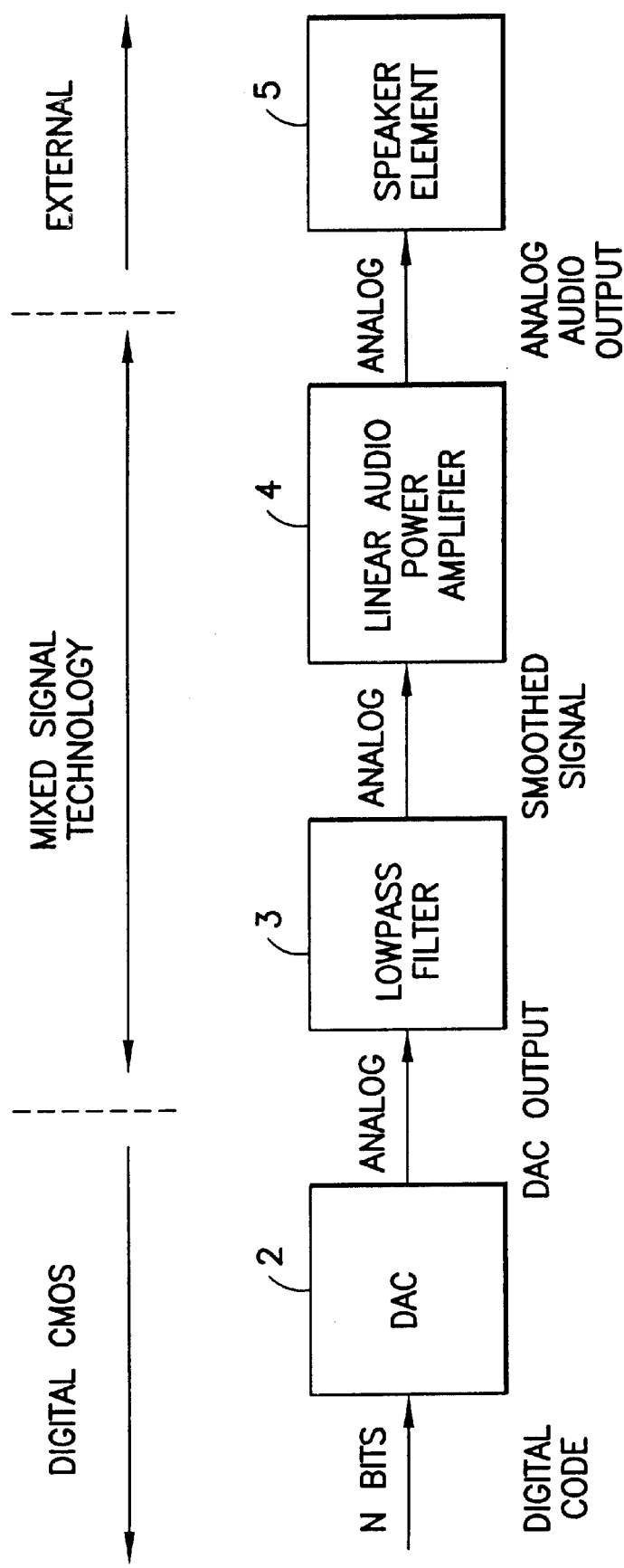
FIG. 1 is simplified block diagram of a conventional audio reproduction path.
Figure 2:
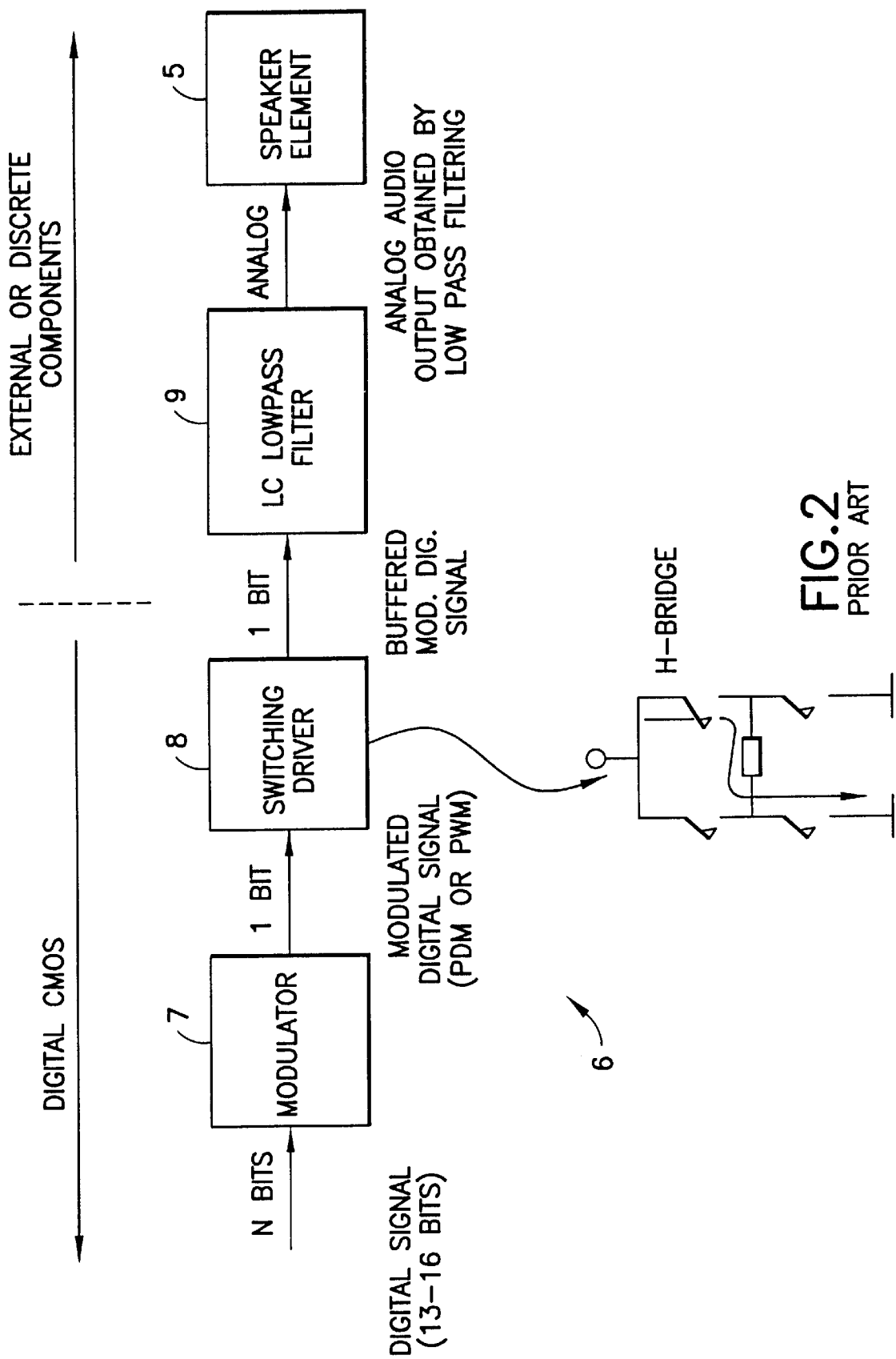
FIG. 2 is a simplified block diagram of a conventional class D audio reproduction system.

The feedback circuitry of FIG. 4 includes the error measurement block 16 and the PWM correction block 13, and the feedback circuitry can be seen to form a local feedback loop around the output switching stage 14, for example, the H-bridge shown in FIG. 2.

An optional global feedback loop is shown in dashed outline as well in FIG. 4. The optional feedback loop closes the loop from the load 15 back to at least one of the sigma-delta modulator 11 or the PW correction block 13. In this approach the feedback signal is taken from an output terminal of the load 15, preferably after the LC filter, and is applied to the controlled component(s).

Figure 3A:
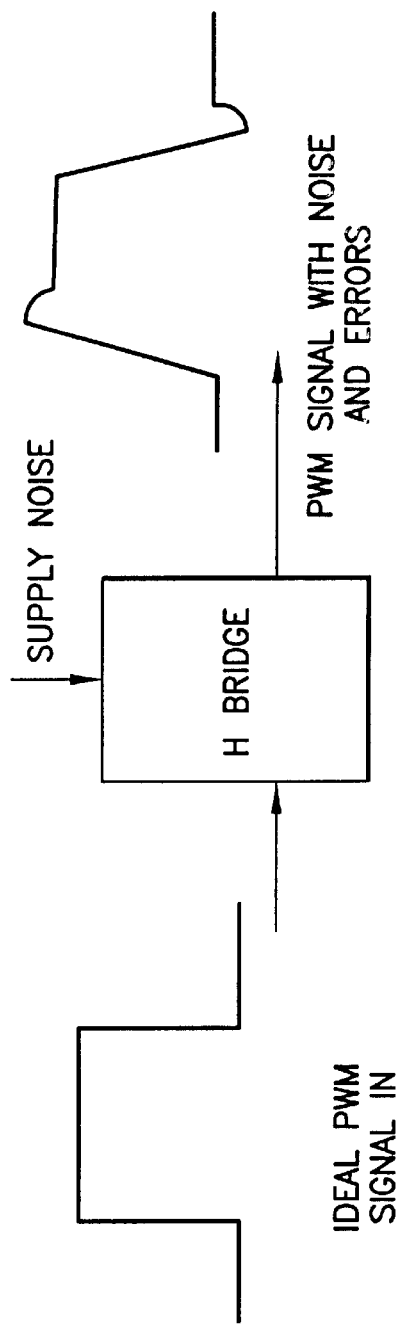
FIGS. 3A and 3B are waveform diagrams that are useful in explaining the non-ideal operation of a conventional switching power stage.
Figure 3B:
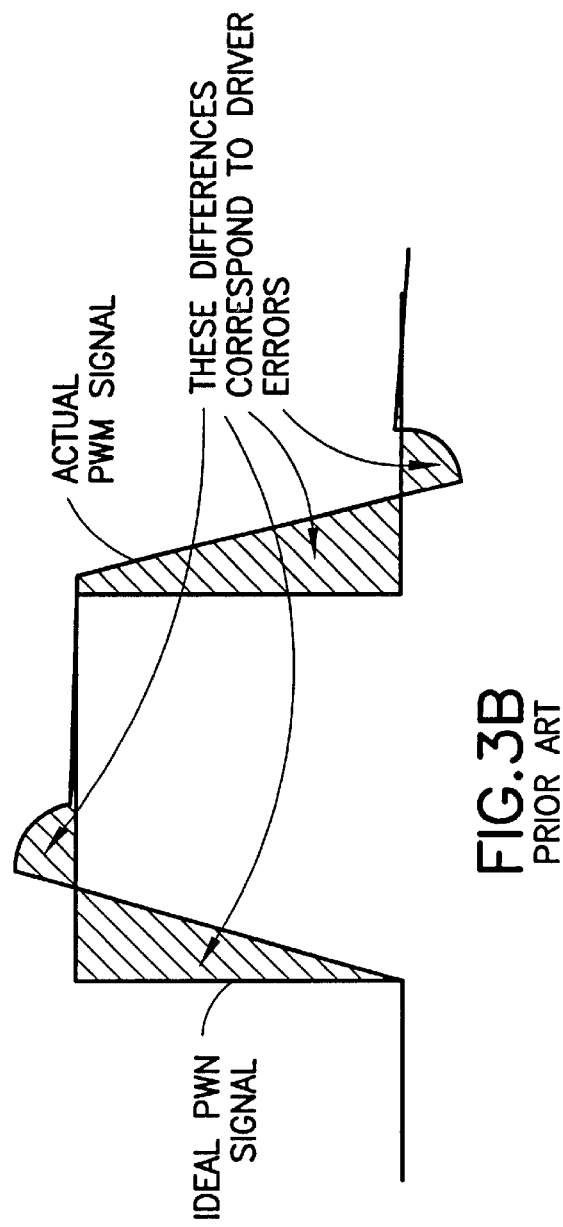
Figure 6A:
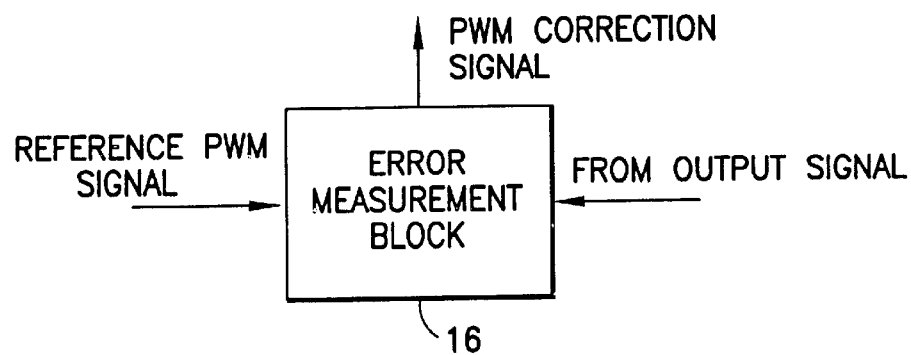
Figure 6B:
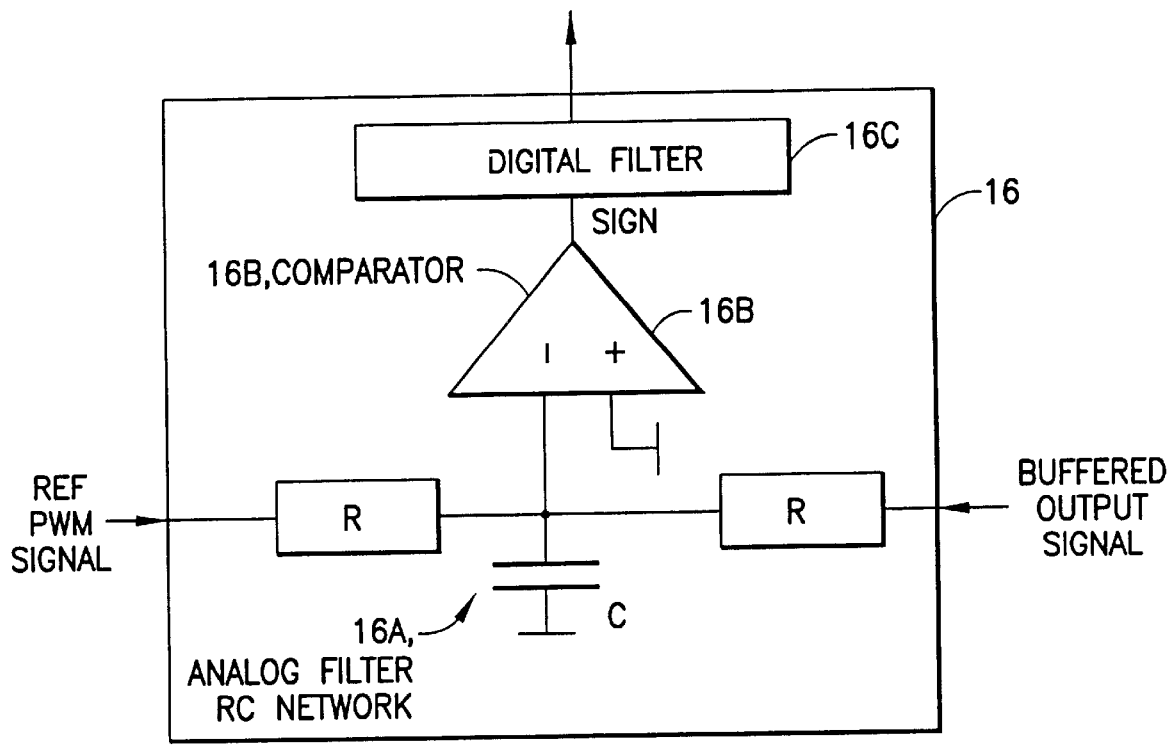
FIG. 6B is a circuit diagram of one embodiment of the error measurement block.

FIG. 6A shows the error measurement block 16 of FIG. 4, while FIG. 6B is a circuit diagram of one embodiment of the error measurement block 16. The error measurement block 16 can be seen to contain a simple (analog) filter 16A, such as a passive RC network or, for improved performance, an active RC integrator, as well as a digital comparator 16B and a digital error signal filter 16C. The error measurement block 16 operates, in the illustrated embodiment, to generate a digital correction signal that reflects the difference between the PWM output waveform and the actual waveform output from the switching stage 14. As is shown in FIGS. 3A and 3B, due to driver and other errors these two waveforms are typically not identical to one another (the ideal case), and the output of the error correction block 16 thus reflects these differences in waveform shape.

In greater detail, the filter 16A of FIG. 6B operates to measure the short-term averaged difference between the reference PWM signal and the actual output signal of the switching stage 14. The reference PWM signal output from the PWM modulator 12 is assumed to be ideal, and is further assumed to be generated from a clean and well-regulated power supply. This latter assumption is feasible to realize, as the actual power taken from the power supply that powers the PWM modulator 12 is relatively low. The comparator 16B compares the filtered and combined reference PWM signal and the buffered output signal to some predetermined potential, such as ground, and detects the sign of the error (difference) signal depending on whether the error signal is greater than or less than the predetermined potential (e.g., ground). In other embodiments the predetermined potential need not be ground potential. The comparator 16C outputs a corresponding 1-bit signal (0 or 1) for indicating the sign of the filtered difference between the reference PWM signal and buffered output signal. A current 1-bit error signal is filtered digitally in block 16C, which can be implemented as a simple two tap Finite Impulse Response (FIR) filter, and the resulting 2-bit signal (00, 01, 10 or 11) is used to modify the leading and trailing edges of the PWM signal, as described below. In this case the 2-bit signal reflects the state of the current 1-bit error signal from the comparator 16C, as well as the previous state of the 1-bit error signal.

It is pointed out that the 1-bit error signal can be derived from one sample or from multiple samples (from one pulse) within a predetermined period of time.

Figure 6C:
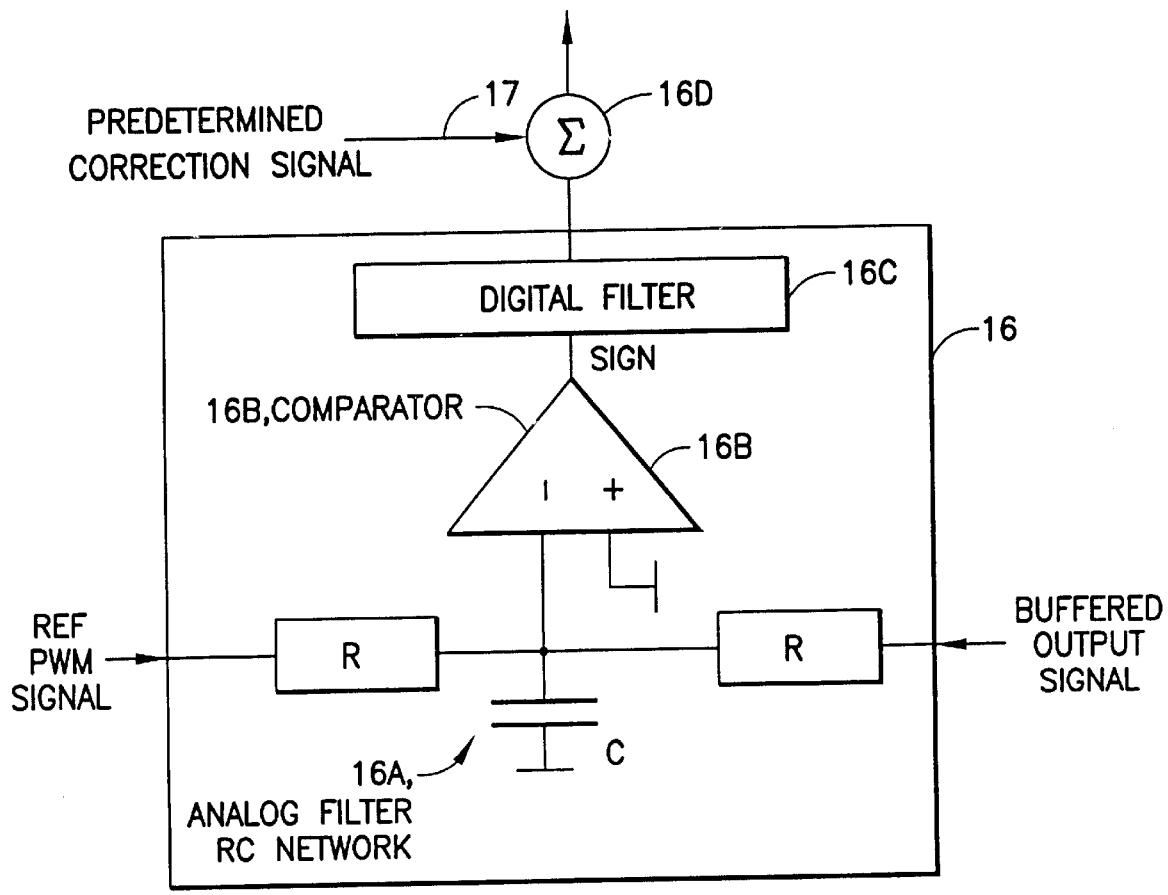
FIG. 6C is a circuit diagram of another embodiment of the error measurement block.

FIG. 6C shows another embodiment of the error measurement block 16 of FIG. 4, wherein a summation junction 16D is added to the output. In this case a predetermined correction signal 17 is (digitally) added to the output of the error measurement block 16. The correction signal 17 is employed to compensate for differences in the battery DC potential for various operating conditions, such as whether the unit is transmitting or receiving, and/or whether the battery is at the beginning or the end of a particular charge/discharge cycle.

Figure 6D:
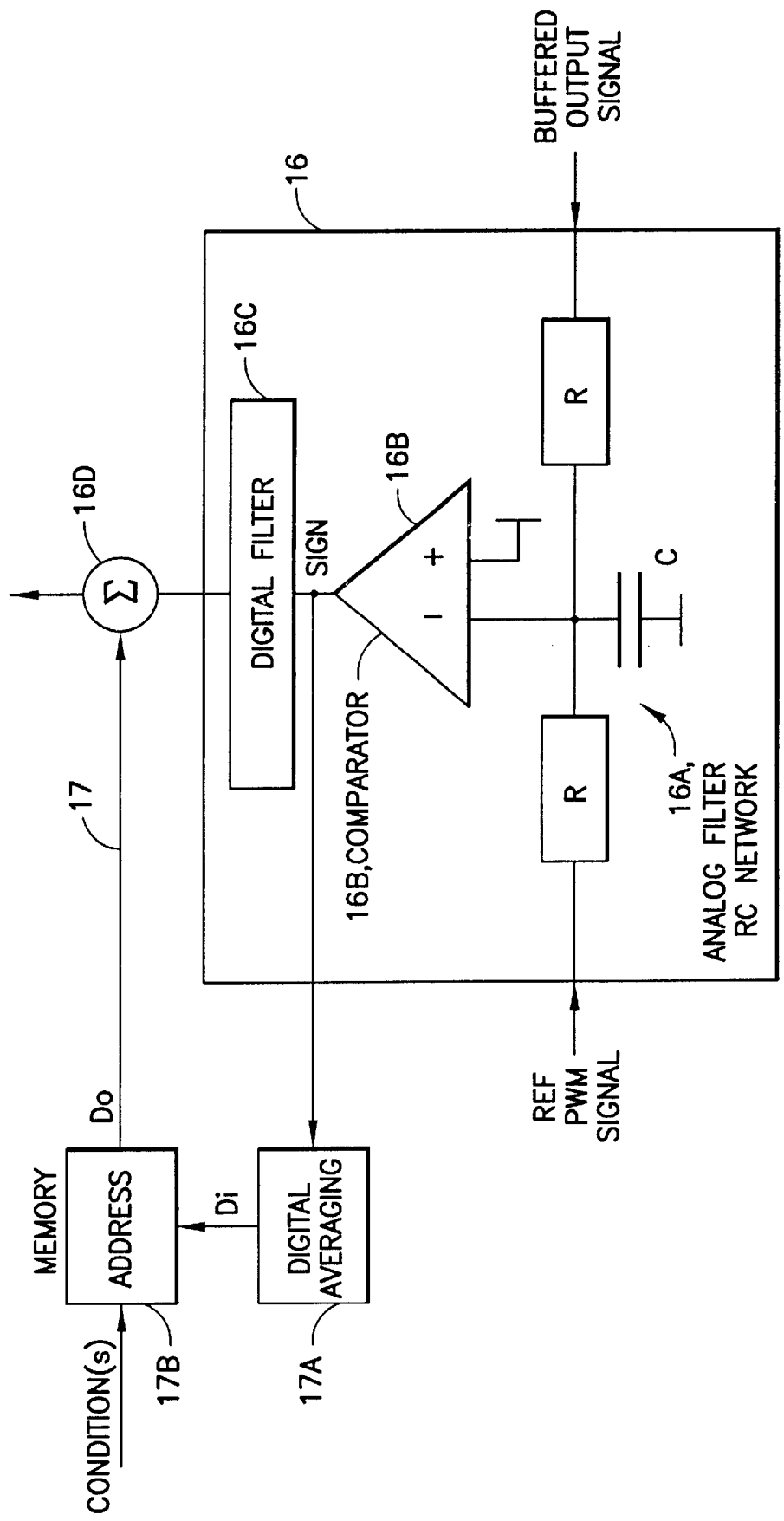
FIG. 6D is a circuit diagram of a further embodiment of the error measurement block and associated circuitry.

FIG. 6D shows a presently preferred technique for generating the predetermined correction signal 17 of FIG. 6C. In this embodiment the one bit sign signal at the output of the comparator 16B is applied to a digital averaging block 17A. The 1-bit sign signals are averaged over a period of time and stored in a memory 17B that is addressed by a multi-bit signal that indicated the mode(s) or condition(s) of the wireless terminal. Examples include whether the wireless terminal is transmitting or receiving (transmitting generally causes a larger battery drain than receiving), and/or whether the battery is at the beginning (fully charged) or the end (nearly completely discharged) of a particular charge/discharge cycle. Another condition may be whether the wireless terminal is connected to an external power source, such as a battery charger. For each particular mode or condition, reflected in the address inputs to the memory 17B, a particular memory location is addressed to obtain a correction signal used for compensation for that mode. The output ($D_i$) of the digital averaging block 17A is also stored therein, thereby updating the previously stored value. This value read out ($D_o$) is applied to the summation junction 16D as the one bit correction signal 17. In essence, the operation of correcting the PWM signal that is input to the driver or switching stage 14 includes an initial step of modifying the correction signal as a function of a current operational mode and the condition of the DC power source (e.g., battery) that supplies power to the driver stage 14.

The purpose of the memory 17B is thus to store correction signals for different operating modes. While the output of the digital averaging block 17A could be applied directly to the summing junction 16D, the use of the memory 17B is preferred as faster compensation is achieved when switching from mode to mode (e.g., from transmit to receive and vice versa). The memory 17B stores the latest correction signal for each mode, and the stored correction signal can be updated with the output of the digital averaging block 17A.

FIG. 7A shows the pulse width correction (PWC) block of FIG. 4, while FIG. 7B is a diagram that is useful in explaining the operation of the PWC block 13. The PWC block 13 operates to change the width of the PWM signal fed to it from the PWM modulator 12 by interpolating the input waveform (corresponding to, for example, a 16-bit word) to (in this example) a 32-bit word. The clock speed is also doubled which effectively doubles the time resolution of the PWM signal that is applied to the switching stage 14. The digitally filtered (for example, 2-bit) error correction signal output from the error measurement block 16 is applied, in the preferred embodiment, to both the leading and trailing edges of the interpolated PWM signal and thus provides an effective 4-bit PWM correction range at each edge. The correction can also be applied separately to the leading and trailing edges. The overall result of this feedback/correction mechanism is an attempt to adjust the pulse width (area) of the PWM signal output from the power stage 15 to be equal to the area of the ideal PWM signal output from the PWM block 12. By so doing the circuitry operates to minimize noise in the signal applied to the load 15 that is due to non-ideal switching, power supply noise and power supply voltage variations.

It is preferred, but not required, that the time resolution of the power stage 14 input signal be increased by interpolation in order to take full advantage of the of the error correction loop. While a factor of two interpolation is shown in FIG. 7B, the input signal PWM signal could as well be interpolated by some other factor (e.g., by four), and in this case the digital filter 16C can be modified to accumulate the current and past three error (sign) bits accordingly (i.e., a four tap delay line). The use of interpolation, as well as the digital filter 16C, can be made optional. If not used then the non-interpolated PWM signal, or an interpolated version thereof, can simply be adjusted with a one bit range at the leading and trailing edges using the current value of the output of the comparator 16B. The correction can also be applied in a single-sided fashion (to the leading or the trailing edge), but this approach is less preferred as applying the correction both the leading and trailing edges results in less distortion.

Figure 8:
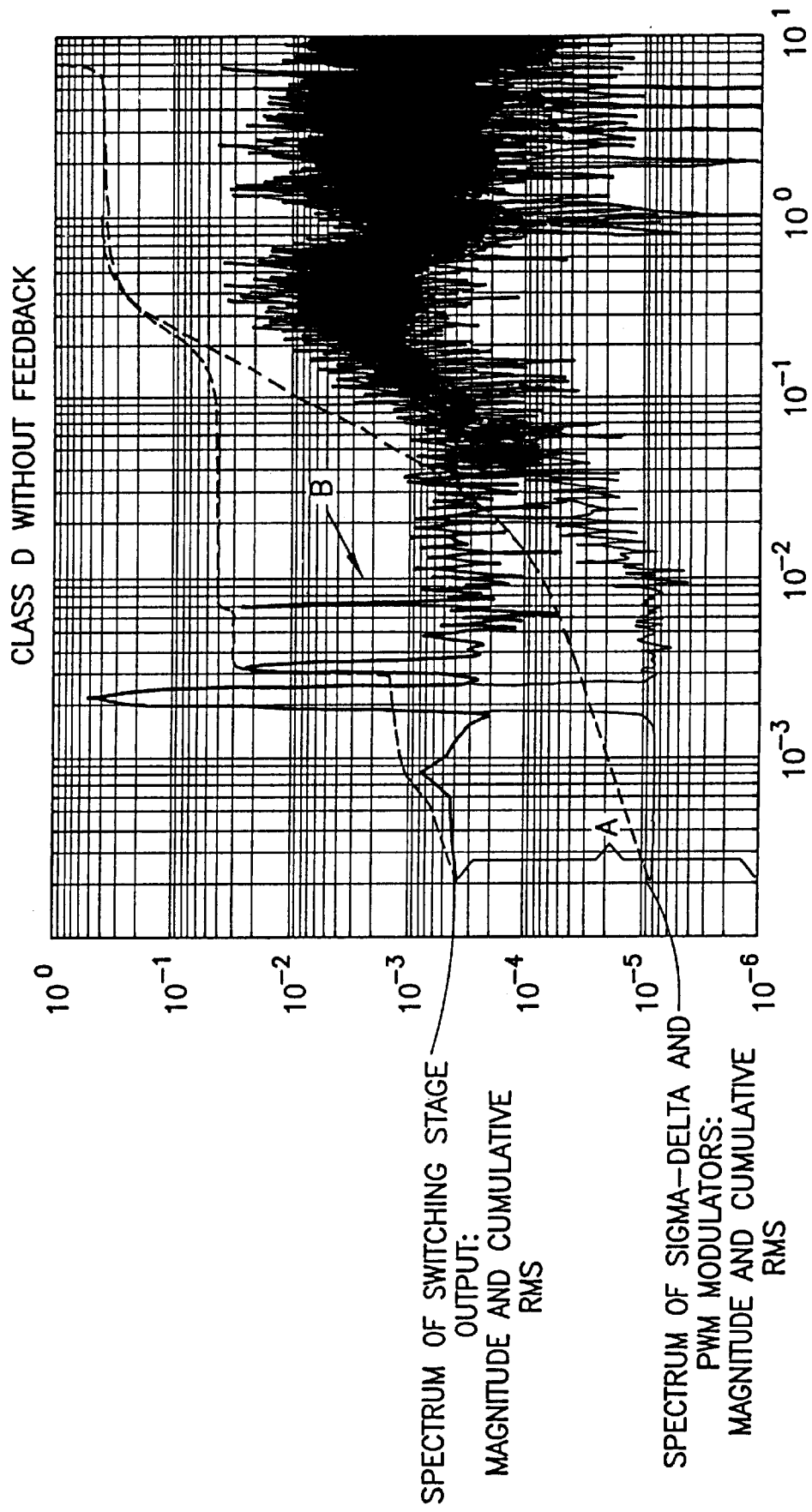
FIG. 8 depicts the spectra of a class D modulator and switching stage without the use of the feedback that is a feature of this invention.
Figure 9:
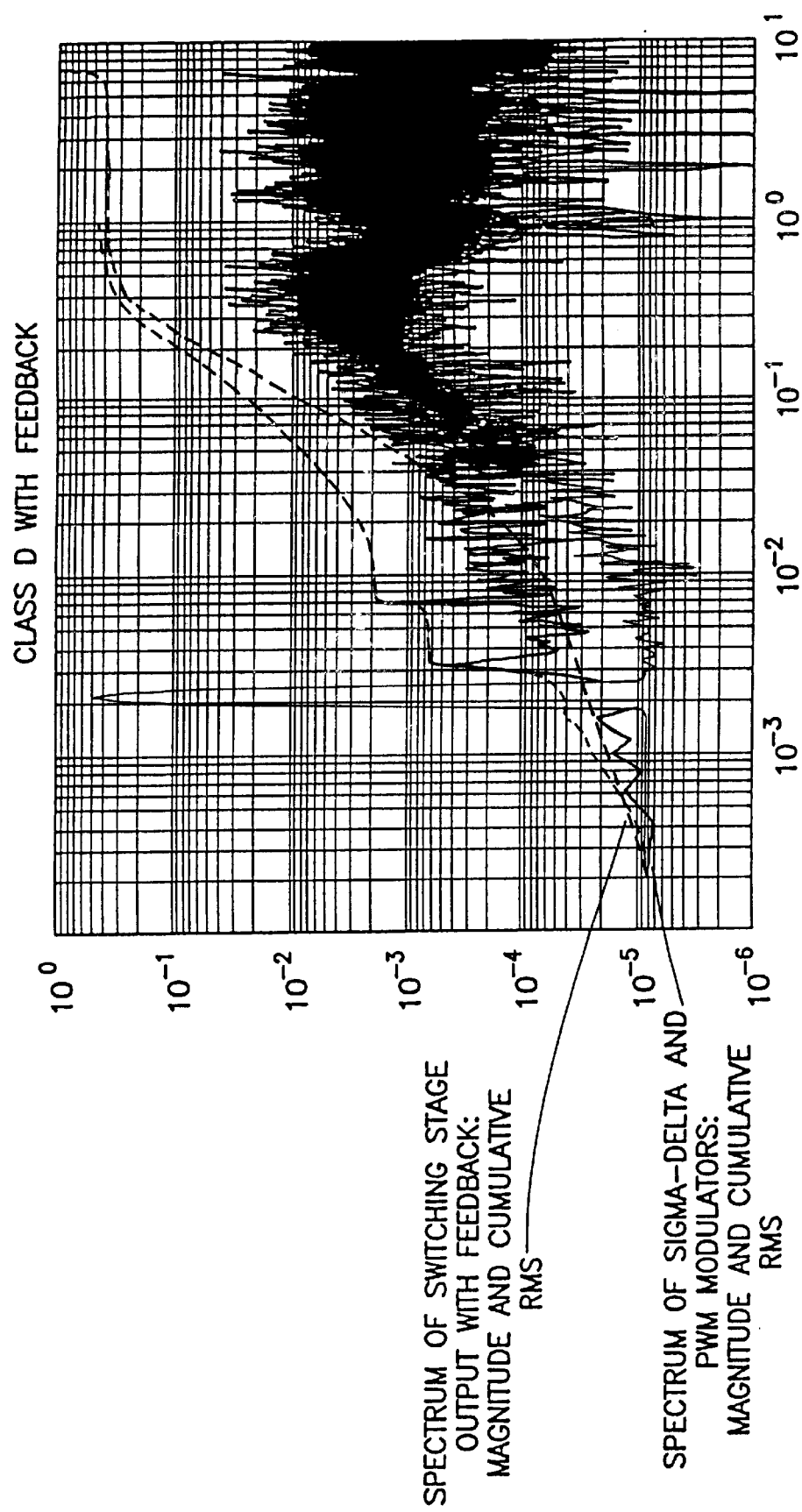
FIG. 9 depicts the improved spectra of the class D modulator and switching stage achieved with the use of the feedback that is a feature of this invention.

FIG. 8 depicts a simulated spectra of a class D modulator and switching stage 14 without the use of the feedback that is a feature of this invention; while FIG. 9 depicts the improved spectra of the class D modulator and switching stage 14 achieved with the use of the feedback that is a feature of this invention. In FIG. 8 the offset indicated as "A" is generally due to power supply noise, while the noise components generally indicated as "B" are due to intermodulation products, errors introduced by the switching stage 15 (e.g., H-bridge), as well as power supply noise. In the simulation the sigma-delta modulator 11 operated with eight quantization levels and the PWM signal was interpolated by a factor of four. An active RC integrator 16A and a two tap FIR filter 16C was employed in the error measurement block 16. The output of the switching stage 14 was amplitude modulated (0.1) with a signal 2.5 times the signal frequency and random noise (SD=0.1) was added to it to simulate power supply noise and variations. The output spectrum shown in FIG. 8 contains peaks with a magnitude of 0.025 at frequencies of 1.5 and 2.5 times that of the signal peak. FIG. 9 illustrates the significant improvement that is obtained through the use of the feedback technique in accordance with these teachings, wherein the noise floor and the peaks are attenuated to less that one tenth (by more than 20 dB) at low frequencies. By increasing the time resolution for the PW correction block 13 and making a corresponding change to the digital filter 16C, the output stage noise can be reduced even further.

While described in the context of circuitry that can be implemented in an integrated circuit using, for example, a CMOS process, those skilled in the art should appreciate that these teachings can be implemented as well using a suitably programmed digital signal processor (DSP).

The sigma-delta modulator 11 is assumed to be optimized (e.g., number of bits, over-sampling ratio) for a given application. A suitable goal is to achieve the required performance requirements with a sampling frequency in the range of about 300 kHz to about 400 kHz in order to obtain the best performance from the switching stage 14.

The total PWM correction range (width) and the number of correction levels are related to the maximum correction capability. For example, if the power supply and driver errors are assumed to be about 10% of the signal amplitude, then the pulse width adjustment range provided by the feedback loop should also be about 10%.

In general, the correction feedback loop operates as a noise-shaping error-feedback loop whose quantization noise is proportional to the time resolution of the corrected PWM signal. The time resolution of the PWM error correction is beneficially interpolated by a factor in the range of about two to eight, relative to the reference PWM signal, in order to preserve modulation performance in the PW correction block 13.

The use of this invention can provide for attenuating errors introduced in the switching stage 14 by about 20 dB to 30dB. The use of this invention can provide for an improved, high efficiency audio reproduction path in mobile terminals, such as cellular telephones, and other applications, such as multi-media applications.

While the invention has been particularly shown and described with respect to preferred embodiments thereof, it will be understood by those skilled in the art that changes in form and details may be made therein without departing from the scope and spirit of the invention.

What is claimed is:

1. A signal path, comprising:
    a sigma-delta modulator (SDM) for receiving an N-bit digital signal;
    a pulse width modulator (PWM) coupled to an output of said SDM for receiving an n-bit digital signal output therefrom, said PWM having an output for outputting a pulse width modulated waveform signal in accordance with said n-bit digital signal;
    a PWM waveform signal correction circuit coupled to an output of said PWM and outputting a corrected pulse width modulated waveform signal;
    a class D switching stage coupled to an output of said PWM waveform correction circuit for being driven by said corrected pulse width modulated waveform signal and providing a signal path output for driving a load; and
    an error measurement block having a first input coupled to said output of said switching stage, a second input coupled to said output of said PWM, and an output coupled to a correction input of said PWM waveform signal correction circuit; said error measurement block obtaining a difference between a first signal appearing at said first input and a second signal appearing at said second input and outputting at said output a digital correction signal that indicates a sign of the difference between said first input signal and second input signal.

2. A signal path as in claim 1, wherein said error measurement block comprises an RC network for filtering and combining said first signal and said second signal, and a digital comparator for comparing an output of said RC filter to a predetermined potential.

3. A signal path as in claim 1, wherein said RC network comprises an active RC integrator.

4. A signal path as in claim 2, wherein said error correction block further comprises a digital filter for outputting said digital correction signal as a multi-bit digital correction signal that includes a current sign of the difference between said first input signal and second input signal and at least one past sign of the difference between said first input signal and second input signal.

5. A signal path as in claim 1, wherein said PWM waveform signal correction circuit operates to adjust at least one of a leading edge or a trailing edge of a signal output by said PWM to generate said corrected pulse width modulated waveform signal.

6. A signal path as in claim 5, wherein said PWM waveform signal correction circuit operates to first interpolate said signal output by said PWM to increase the resolution of the correction.

7. A signal path as in claim 6, wherein said signal output by said PWM is in a thermometer format.

8. A signal path as in claim 6, wherein said PWM waveform signal correction circuit interpolates said signal output by said PWM by a factor in a range of about two to eight.

9. A signal path as in claim 1, wherein N is in the range of about 13 to 16, and wherein n is in the range of about two to eight.

10. A signal path as in claim 1, wherein said signal path functions as an audio reproduction path in a mobile terminal, and is embodied in an integrated circuit.

11. A method for compensating a pulse width modulated (PWM) signal, comprising steps of:
generating a PWM signal for application to a driver stage;
obtaining a filtered difference between the PWM signal and a version of the same PWM signal after the driver stage;
generating a digital correction signal that is indicative of a sign of the filtered difference; and
using the digital correction signal for adjusting at least one of the leading edge or the trailing edge of the PWM signal so as to compensate the version of the same PWM signal after the driver stage.

12. A method as in claim 11, wherein the steps of obtaining and generating comprise steps of RC filtering, digital comparison and digital filtering.

13. A method for compensating a pulse width modulated (PWM) signal, comprising steps of:
generating a PWM signal for application to a driver stage;
obtaining a filtered difference between the PWM signal and a version of the same PWM signal after the driver stage;
generating a correction signal that is indicative of a sign of the filtered difference; and
using the correction signal for adjusting at least one of the leading edge or the trailing edge of the PWM signal so as to compensate the version of the same PWM signal after the driver stage, wherein the step of generating generates a one-bit correction signal.

14. A method for compensating a pulse width modulated (PWM) signal, comprising steps of:
generating a PWM signal for application to a driver stage;
obtaining a filtered difference between the PWM signal and a version of the same PWM signal after the driver stage;
generating a correction signal that is indicative of a sign of the filtered difference; and
using the correction signal for adjusting at least one of the leading edge or the trailing edge of the PWM signal so as to compensate the version of the same PWM signal after the driver stage, wherein the step of adjusting comprises initial steps of combining two successive digital signals into one longer PWM sample, and interpolating the longer PWM sample by a factor in a range of about two to eight.

15. A method for compensating a pulse width modulated (PWM, signal, comprising steps of:
generating a PWM signal for application to a driver stage;
obtaining a filtered difference between the PWM signal and a version of the same PWM signal after the driver stage;
generating a correction signal that is indicative of a sign of the filtered difference; and
using the correction signal for adjusting at least one of the leading edge or the trailing edge of the PWM signal so as to compensate the version of the same PWM signal after the driver stage, wherein the step of adjusting comprises initial steps of doubling one digital signal into one longer PWM sample, and interpolating the longer PWM sample by a factor in a range of about two to eight.

16. A method for compensating a pulse width modulated (PWM) signal, comprising steps of:
generating a PWM signal for application to a driver stage;
obtaining a filtered difference between the PWM signal and a version of the same PWM signal after the driver stage;
generating a correction signal that is indicative of a sign of the filtered difference; and
using the correction signal for adjusting at least one of the leading edge or the trailing edge of the PWM signal so as to compensate the version of the same PWM signal after the driver stage, wherein the step of generating generates the PWM signal from a multi-bit signal output from a sigma-delta modulator.

17. A method as in claim 16, wherein the multi-bit signal has $2^n$ quantization levels, where n is in a range of about two to about eight.

18. A method as in claim 11, wherein said driver stage comprises a class D amplifier switching stage.

19. A method as in claim 11, wherein the step of compensating compensates for driver stage non-linearities and for power supply noise and variations.

20. A method as in claim 11, wherein the step of correcting includes an initial step of modifying the correction signal as a function of a current operational mode and a condition of a DC power source that supplies power to the driver stage.

21. A method for operating a battery powered mobile communication terminal for compensating a pulse width modulated (PWM) signal that feeds a switching power stage, comprising:
generating a PWM signal for application to a power stage;
obtaining a filtered difference between the PWM signal and a version of the same PWM signal after the power stage;
generating a digital correction signal that is indicative of a sign of the filtered difference;
modifying said digital correction signal as a function of a magnitude of a DC battery voltage under different operating conditions of said mobile communication terminal; and
adjusting at least one of the leading edge or the trailing edge of the PWM signal in accordance with said modified digital correction signal.

22. A method as in claim 21, where the operating conditions comprise the mobile communication terminal being in a transmitting state or in a receiving state.

23. A method as in claim 21, where the operating conditions comprise a charge state of said battery.

24. A method as in claim 21, where the operating conditions comprise a connection to an external power source.

25. A battery powered mobile communication terminal comprising a circuit for generating a pulse width modulated (PWM) signal that feeds a switching power stage, said circuit comprising means obtaining a filtered difference between the PWM signal and a version of the same PWM signal after the power stage; means for generating a digital correction signal that is indicative of a sign of the filtered difference; means for modifying said digital correction signal as a function of a magnitude of a DC battery voltage under different operating conditions of said mobile communication terminal; and means for adjusting at least one of the leading edge or the trailing edge of the PWM signal in accordance with said modified digital correction signal.

26. A battery powered mobile communication terminal as in claim 25, where the operating conditions comprise the mobile communication terminal being in a transmitting state or in a receiving state.

27. A battery powered mobile communication terminal as in claim 25, where the operating conditions comprise a charge state of said battery.

28. A battery powered mobile communication terminal as in claim 25, where the operating conditions comprise a connection to an external power source.

* * * * *